United States Patent
Cottier et al.

(10) Patent No.: US 7,230,873 B2
(45) Date of Patent: Jun. 12, 2007

(54) FORCED PULLDOWN OF ARRAY READ BITLINES FOR GENERATING MUX SELECT SIGNALS

(75) Inventors: Scott Raymond Cottier, Cedar Park, TX (US); Shohji Onishi, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 10/970,452

(22) Filed: Oct. 21, 2004

(65) Prior Publication Data

US 2006/0087878 A1   Apr. 27, 2006

(51) Int. Cl.
*G11C 8/00* (2006.01)
(52) U.S. Cl. .................... 365/230.05; 365/230.06; 365/189.11
(58) Field of Classification Search ............ 365/145, 365/154, 156, 230.05, 230.06, 189.01, 189, 365/189.1
See application file for complete search history.

(56) References Cited

U.S. PATENT DOCUMENTS

| 5,790,454 A | * | 8/1998 | Choi ............... 365/185.03 |
| 2002/0196667 A1 | * | 12/2002 | Ikehashi et al. ....... 365/185.24 |
| 2006/0083074 A1 | | 4/2006 | Cottier et al. |

* cited by examiner

*Primary Examiner*—Gene N. Auduong
(74) *Attorney, Agent, or Firm*—Stephen R. Tkacs; Stephen J. Walder, Jr.; D'Ann N. Rifai

(57) ABSTRACT

An apparatus, a method, and a computer program product are provided for time reduction in an array read access control consisting of a bitcell and a pulldown device outside of the bitcell. To reduce gate delay, this design implements a pulldown device that controls the bitcell readout. A pulldown signal is generated to activate the pulldown device. Therefore, the pulldown signal can control the pulling down of the bitcell readout without a complete read of the data array inside the bitcell. This design reduces gate delay because the dependency upon the gating logic is overridden and the number of stages is reduced.

20 Claims, 4 Drawing Sheets

FORCED PULLDOWN OF ARRAY READ BITLINES FOR GENERATING MUX SELECT SIGNALS

FIELD OF THE INVENTION

The present invention relates generally to array read access controls, and more particularly, to array read access controls involving the forced pulldown of array readouts from a bitcell.

DESCRIPTION OF THE RELATED ART

Standard bitcells and array read access controls are used in data processing systems to perform the function of accepting written data, storing this data in arrays, reading this data and then transforming the data into decoded select signals. There is a constant search to reduce the time delay involved with producing these decoded select signals. Conventional array read access designs consist of a conventional bitcell with a read port followed by specific gating logic to generate the desired multiplexer (MUX) select signals. After a write is performed the bitcell will store the information as data in an array. Then the bitcell produces a readout of this data and that readout will be gated to produce the desired MUX signals. Any operation that is based upon the read result from the bitcell will require additional clock cycles, which increases the time delay of the circuit. If the gate delay stages are reduced, then the array read timing operation becomes less critical and the devices may be sized to achieve greater reliability and/or lower power.

Referring to FIG. 1 of the drawings, reference numeral 100 generally indicates a conventional bitcell with a read port. The write wordline 105 is connected to the gates of two n-channel field effect transistors (NFETs) 120 and 125. The write bitline 110 is connected to the source of NFET 120. The drain of NFET 120 is connected through junction 130 as an input of inverter 135. The output of inverter 135 is connected to junction 140, which is connected to the source of NFET 125. The complement of the write bitline 115 exists at the drain of NFET 125. Another inverter 145 is connected with its input attached to junction 140 and its output attached to junction 130. The two NFETs 120 and 125, and the two inverters in series 135 and 145, create a static memory cell 150, which maintains a constant value in the bitcell. When the write wordline 105 is on, the values on the write bitlines 110 and 115 will be passed to the memory cell 150, and the memory cell 150 will hold new values at junctions 130 and 140. Junction 140 is also connected to the gate of NFET 155.

The drain of NFET 155 is connected to the source of NFET 170. The read wordline 160 is connected to the gate of NFET 170. The drain of NFET 170 is the read bitline 165. The NFET 170 and the NFET 155 make up the pulldown device 175, and both transistors must be activated before the read bitline 165 will pull down. If NFET 155 is not activated, then the read bitline 165 will maintain its precharged state. The source of NFET 155 is connected to ground 180. The pulldown device 175 allows the signal that has been read to be pulled down as a readout of the read bitline 165. At this point the readout of the bitcell can be gated to produce the MUX select signals.

Referring to FIG. 2 of the drawings, reference numeral 200 generally indicates a block diagram depicting the conventional array readout of a standard bitcell followed by signal gating. The bitcell 208 corresponds to FIG. 1, reference numeral 100. The Array Bit Slice 205 depicts an array of bitcells 208 as they would appear in a processor. The readout 210 corresponds to the read bitline 165 in FIG. 1. This readout signal 210 is produced by the bitcell with a read port. The readout 210 is then connected to the specific gating logic 220 as an input. Gating signals 215 are also connected to the gating logic 220 as an input. The desired MUX select signals 225 are the output of the gating logic 220.

These separate steps lead to a time delay that was previously described. Any operation that requires a readout signal from the bitcell will require additional clock cycles. This result forces array read devices to be designed with timing constraints as the primary issue. If timing issues are less significant, then array read devices can be designed to be smaller in area, more reliable and/or more power efficient. Therefore, there is a need for a method and/or apparatus to modify conventional array read access controls to perform faster.

SUMMARY OF THE INVENTION

The present invention provides a method, an apparatus, and a computer program for the reduction of time delay for array read access controls consisting of a bitcell and a pulldown device outside of the bitcell. The pulldown device consists of an nFET transistor that is implemented to pull down a readout from the bitcell. A pulldown signal is generated outside of the array core, and is brought into the array core to activate the pulldown device. Overall, a pulldown of the data array from the bitcell can be accomplished without a complete read of the data array. This reduces the number of stages and the time delay of a data array read. As a result of this time delay reduction, the array read timing operation becomes less critical and the devices may be sized to achieve greater reliability and/or lower power consumption.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

Figure 1:
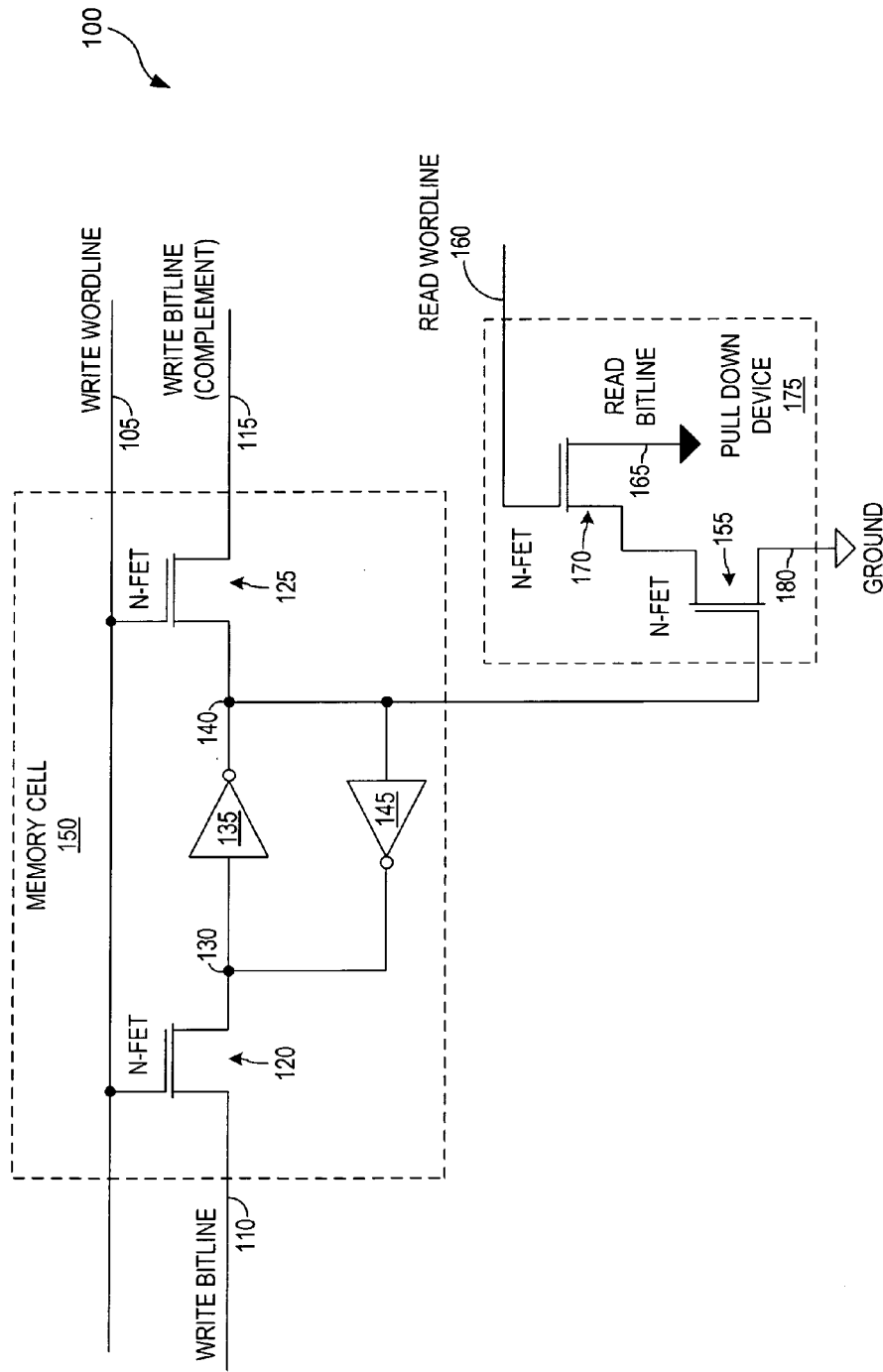
FIG. 1 schematically depicts a conventional bitcell with a read port.
Figure 2:
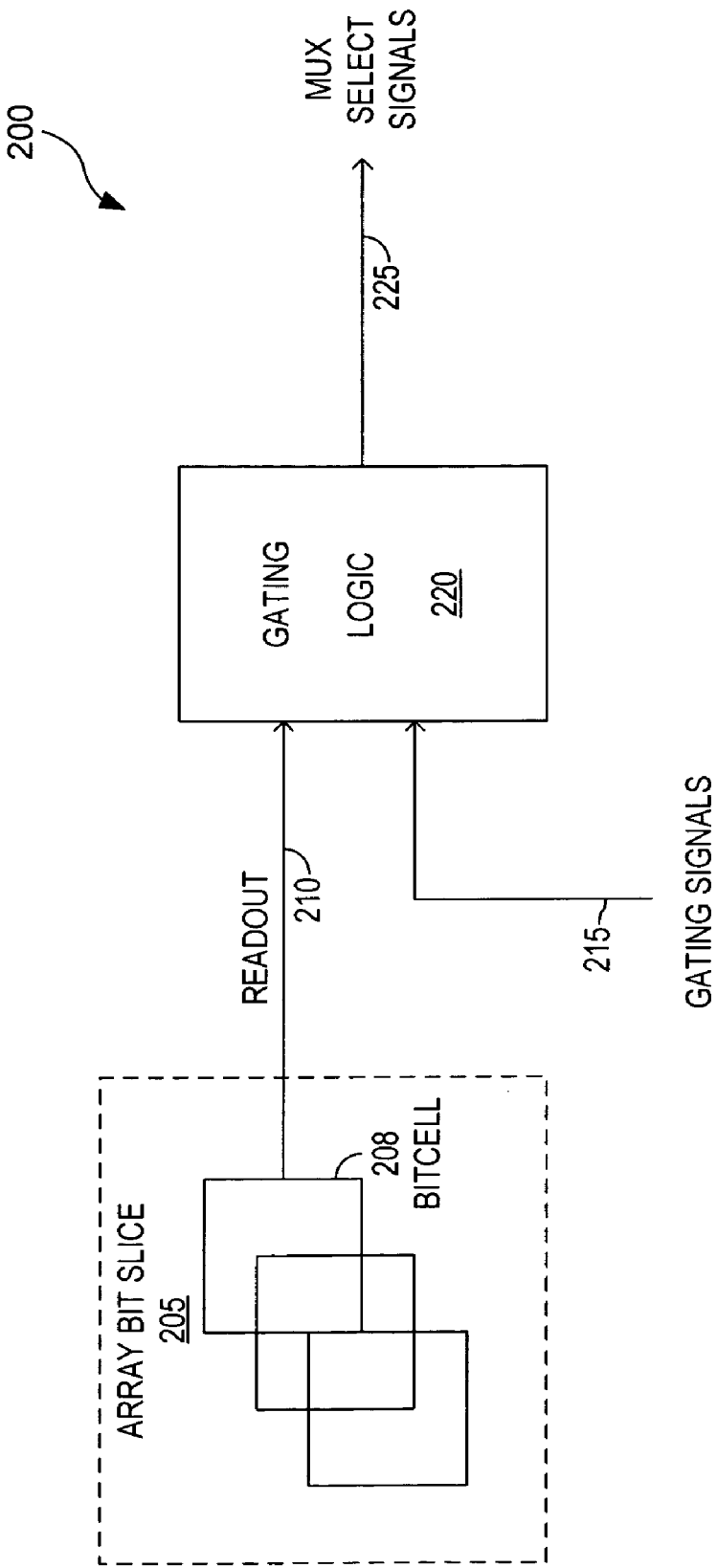
FIG. 2 is a block diagram depicting the readout of conventional bitcells followed by signal gating.
Figure 3:
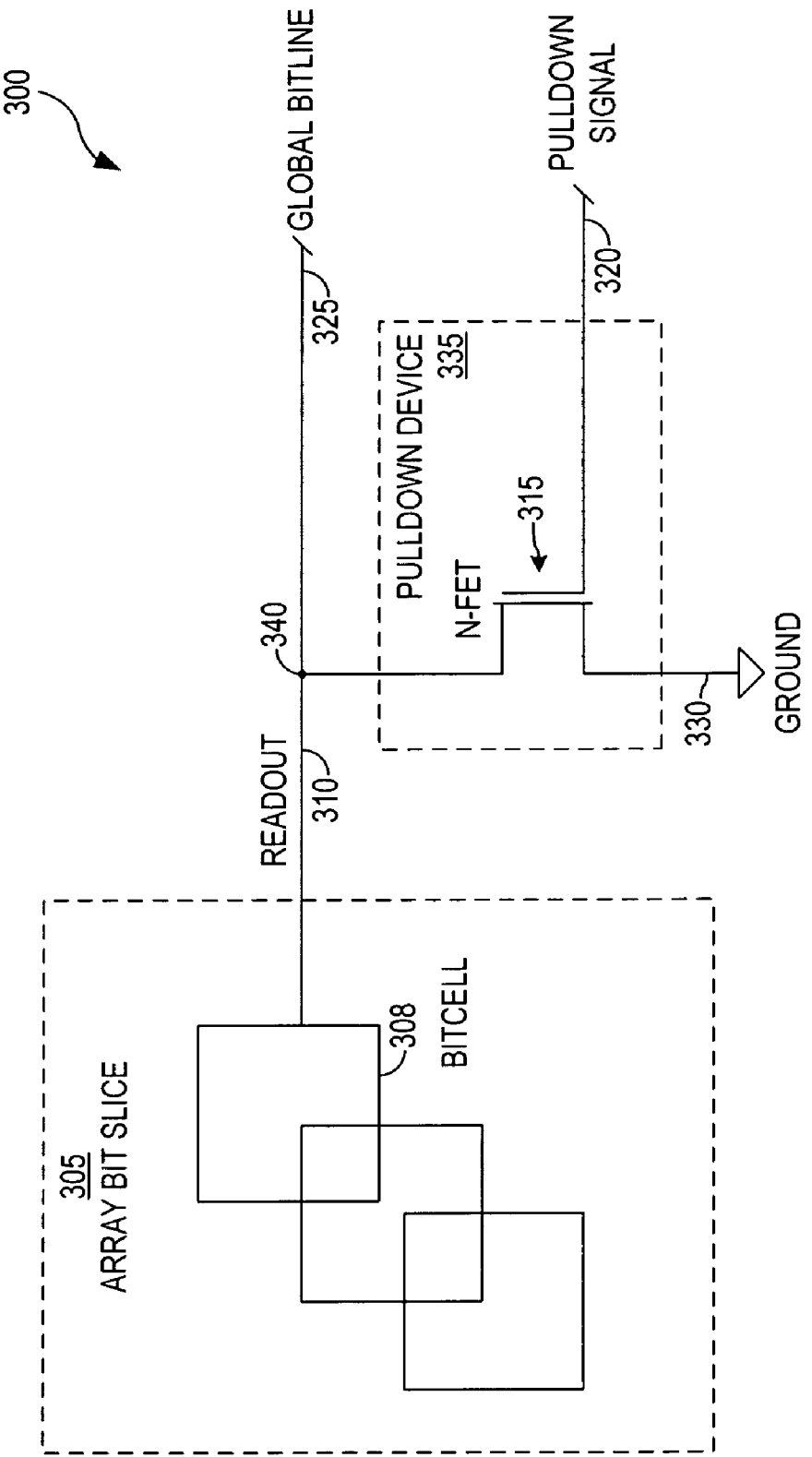
FIG. 3 is a block diagram depicting the forced pulldown of the global bitline from a conventional bitcell.

Referring to FIG. 3 of the drawings, the reference numeral 300 generally depicts a block diagram illustrating the forced pulldown of the global bitline from a conventional bitcell. The bitcell 308 corresponds to the reference numeral 100 in FIG. 1. The Array Bit Slice 305 denotes an array of these bitcells as they would exist in a processor. The readout 310 of the bitcell is pulled down as the global bitline 325 by the pulldown device 335. The readout 310 and the global bitline 325 exist at the same node 340. The readout 310 corresponds to the read bitline 165 in FIG. 1. The global bitline 325 denotes the desired MUX select signals. The pulldown device 335 contains an nFET transistor 315. The pulldown signal 320, which will be controlled by outside gating logic, is connected to the gate of N-channel field effect transistor (NFET) 315. This pulldown signal 320 will activate NFET 315, which pulls down the global bitline 325. The drain of NFET 315 is connected to ground 330. The global bitline 325 is connected to the source of NFET 315 at node 340.

A pulsed clock is used as the bitline pulldown signal 320 and the read wordline signal 160. These two signals should be mutually exclusive but they are not required to be. The best embodiment of this device involves separate pulsed clock signals for the bitline pulldown signal 320 and the read wordline signal 160. An extra clock signal must be shaped and staged along with the read wordline signal 160 and the precharge signals to resolve timing issues, such as contention, float, and pulsewidth. In an embodiment, there is only one instance of gating logic outside of the array core that controls the pulldown device 335. This outside gating logic will be used to produce the pulldown signal 320. The physical area of the array core is reduced because the logic gating is outside of the core. The activation of the write wordlines 105 and the read wordlines 160 must be mutually exclusive.

The use of certain logic outside of the array core to control the global read bitlines allows the removal of the dependency on a read of the data array. A 5:1 multiplexer has four of the five select signals stored in the array as 1-hot and the remaining, master select signal existing outside of the array. The values of all five selects must be 1-hot when controlling the multiplexer. Previous methods require reading the data from the array and gating them with the master select signal to ensure the 1-hot condition among all five signals. This modified design controls these bitlines with the pulldown device 335 and the timing dependency on the gating logic can be overridden. Basically, the pulldown device 335 overrides the bitcell 100, and can pull down the bitline regardless of a standard read of the bitcell value. The pulldown device 335 is controlled by a pulldown signal 320 that is produced outside of the array core.

As shown in FIG. 3 the readout 310 is no longer followed by the additional logic. The outside gating now controls the global bitline 325 and there is no additional delay. The end result is a faster circuit with a significant reduction in gate delay. A major advantage of reducing the gate delay is that the read timing operation becomes less critical and the devices may be sized to achieve greater reliability and/or lower power.

Figure 4:
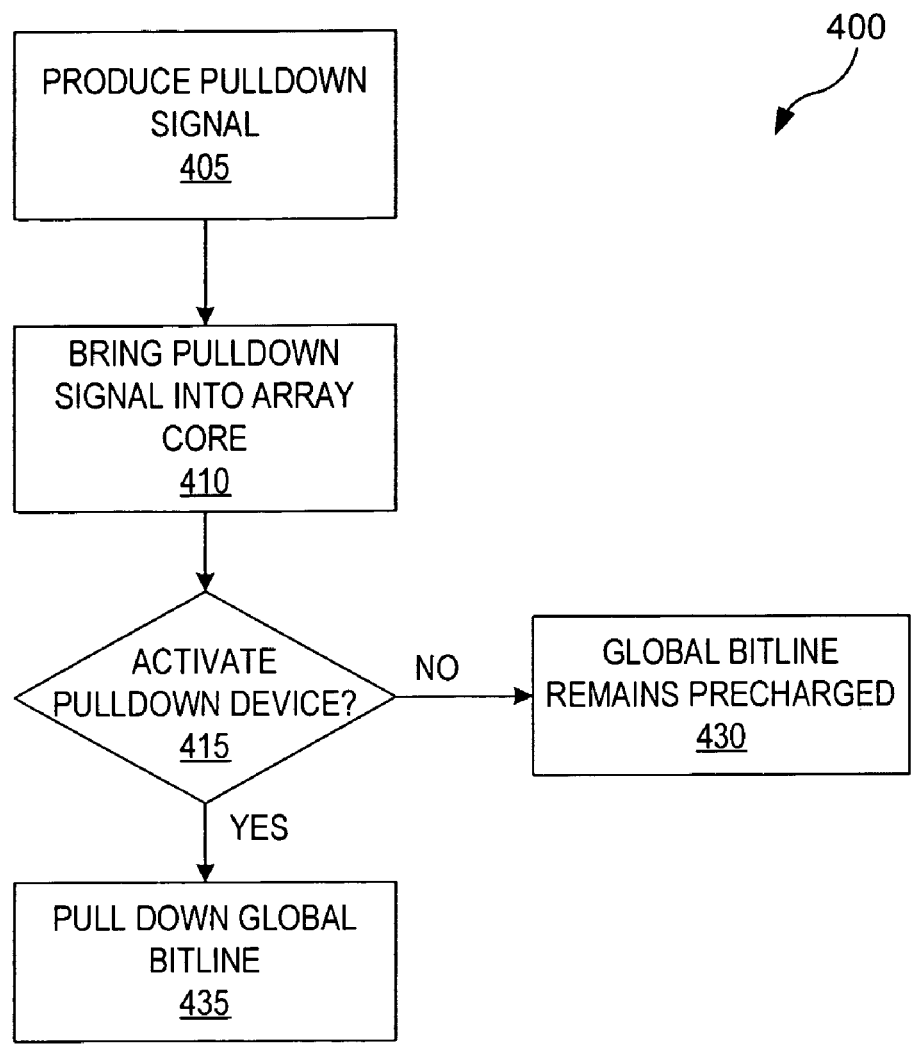
FIG. 4 is a flow chart illustrating the modified process of pulling down a readout from a conventional bitcell.

Referring to FIG. 4 of the drawings, the reference numeral 400 generally indicates a flow chart illustrating the process of pulling down the global bitline from a conventional bitcell. As shown in step 405 the pulldown signal 320 is produced by gating logic outside of the array core. This pulldown signal 320 controls the pulldown device 335. In step 410 the pulldown signal 320 is brought into the array core. In step 415 it is determined whether the pulldown device 335 is activated. If the pulldown signal 320 does not activate the pulldown device 335, then in step 430 the global bitline 325 remains precharged and is not pulled down. If the pulldown signal 320 does activate the pulldown device 335, then the global bitline 325 is pulled down in step 435. Alternatively, the read bitline 165 can be pulled down by a standard read from the value of the bitcell 100 also. The pulldown device 335 overrides the bitcell 100, but if the pulldown device 335 is not activated, then the read bitline 165 can be pulled down by a standard read of the value of the bitcell.

It is understood that the present invention can take many forms and embodiments. Accordingly, several variations of the present design may be made without departing from the scope of the invention. The capabilities outlined herein allow for the possibility of a variety of programming models. This disclosure should not be read as preferring any particular programming model, but is instead directed to the underlying concepts on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. An array core, comprising:
an array of bitcells, wherein each bitcell in the array of bitcells has a bitcell pulldown device that is configured to be activated by a read wordline signal to generate a read bitline; and
a global pulldown device that is connected to a given read bitline and configured to be activated by a global bitline pulldown signal,
wherein a given bitcell within the array of bitcells is selected using the read wordline signal and wherein the given bitcell is connected to the given read bitline;
wherein the bitcell pulldown device of the given bitcell pulls down the given read bitline if a value stored in the given bitcell is zero; and
wherein responsive to the global bitline pulldown signal being asserted, the global pulldown device pulls down the given read bitline regardless of the value stored in the given bitcell.

2. The array core of claim 1, wherein the global pulldown device further comprises an N-channel field effect transistor (nFET) that is configured to be activated by the global bitline pulldown signal.

3. The array core of claim 2, wherein the global bitline pulldown signal further comprises a pulsed clock signal generated by one instance of gating logic.

4. The array core of claim 3, wherein the gating logic exists outside of the array core.

5. The array core of claim 2, wherein the NFET further comprises a gate connection to the global bitline pulldown signal, a drain connection to ground, and a source connection to the given read bitline.

6. The array core of claim 1, wherein responsive to the global bitline pulldown signal being deasserted, the given read bitline is pulled down to zero if the value stored in the given bitcell is zero.

7. The array core of claim 1, wherein responsive to the global bitline pulldown signal being deasserted, the given read bitline maintains a precharged state if the value stored in the given bitcell is one.

8. The array core of claim 1, wherein the global pulldown device pulls down the given read bitline without introducing a time delay.

9. A method for reading a value of an array bitcell comprising:

selecting a given bitcell within an array of bitcells using a read wordline signal, wherein the given bitcell is connected to a read bitline and wherein a bitcell pulldown device within the given bitcell pulls down the read bitline if a value stored in the given bitcell is zero; and responsive to activation of a global bitline pulldown signal, pulling down the read bitline using a global pulldown device regardless of a value stored in the given bitcell.

10. The method of claim 9, wherein the global bitline pulldown signal is a pulsed clock signal generated outside of the array core.

11. The method of claim 9, wherein the global pulldown device comprises an NFET configured to have a gate connection with the bitline pulldown signal, to have a drain connection to ground, and to have a source connection with the given read bitline.

12. The method of claim 9, wherein the global pulldown device is connected to the read bitline, wherein the global pulldown device controls the read bitline.

13. The method of claim 9, wherein responsive to the global bitline pulldown signal being deasserted, the given read bitline maintains a precharged state if the value stored in the given bitcell is one.

14. An apparatus, comprising:

means for selecting a given bitcell within an array of bitcells using a read wordline signal, wherein the given bitcell is connected to a read bitline and wherein a bitcell pulldown device within the given bitcell pulls down the read bitline if a value stored in the given bitcell is zero; and means for pulling down the read bitline regardless of a value stored in the given bitcell responsive to activation of a global bitline pulldown signal.

15. The apparatus of claim 14, wherein the means for pulling down the read bitline comprises a global pulldown device.

16. The apparatus of claim 15, wherein the global pulldown device further comprises an N-channel field effect transistor (nFET) that is configured to be activated by the global bitline pulldown signal.

17. The apparatus of claim 15, wherein the NFET further comprises a gate connection to the global bitline pulldown signal, a drain connection to ground, and a source connection to the given read bitline.

18. The apparatus of claim 15, wherein responsive to the global bitline pulldown signal being deasserted, the given read bitline is pulled down to zero if the value stored in the given bitcell is zero.

19. The apparatus of claim 15, wherein responsive to the global bitline pulldown signal being deasserted, the given read bitline maintains a precharged state if the value stored in the given bitcell is one.

20. The apparatus of claim 15, wherein the global pulldown device pulls down the given read bitline without introducing a time delay.

* * * * *